US012669705B2

(12) United States Patent
Lambert

(10) Patent No.: US 12,669,705 B2
(45) Date of Patent: Jun. 30, 2026

(54) METHOD TO OPTIMIZE UNIFORMITY OF HEAD-UP DISPLAY IMAGE BRIGHTNESS

(71) Applicant: Panasonic Automotive Systems Company of America, Division of Panasonic Corporation of North America, Peachtree City, GA (US)

(72) Inventor: David Kay Lambert, Sterling Heights, MI (US)

(73) Assignee: Panasonic Automotive Systems America, LLC., Peachtree City, GA (US)

( * ) Notice: Subject to any disclaimer, the term of this patent is extended or adjusted under 35 U.S.C. 154(b) by 514 days.

(21) Appl. No.: 18/120,833

(22) Filed: Mar. 13, 2023

(65) Prior Publication Data

US 2023/0296891 A1     Sep. 21, 2023

Related U.S. Application Data

(60) Provisional application No. 63/319,925, filed on Mar. 15, 2022.

(51) Int. Cl.
| | |
|---|---|
| *G02B 27/01* | (2006.01) |
| *G02B 3/00* | (2006.01) |
| *G02B 5/02* | (2006.01) |
| *G02B 5/08* | (2006.01) |
| *H01L 25/16* | (2023.01) |

(52) U.S. Cl.
CPC ....... *G02B 27/0101* (2013.01); *G02B 3/0037* (2013.01); *G02B 5/0273* (2013.01); *G02B 5/0808* (2013.01); *H01L 25/167* (2013.01)

(58) Field of Classification Search
CPC .................................................. G02B 5/0273
See application file for complete search history.

(56) References Cited

U.S. PATENT DOCUMENTS

| | | | | |
|---|---|---|---|---|
| 2019/0317322 A1* | 10/2019 | Hayakawa | ......... | G02B 27/0101 |
| 2019/0353900 A1* | 11/2019 | You | ......... | G02B 27/30 |
| 2020/0201039 A1* | 6/2020 | Park | ......... | G02F 1/1335 |
| 2021/0026137 A1* | 1/2021 | Yuan | ......... | B60K 35/65 |
| 2021/0398953 A1* | 12/2021 | Chen | ......... | H01L 24/17 |
| 2022/0229293 A1* | 7/2022 | Xu | ......... | B60K 35/23 |
| 2023/0367119 A1* | 11/2023 | Iwaya | ......... | G02B 3/005 |

* cited by examiner

*Primary Examiner* — Paul C Lee
(74) *Attorney, Agent, or Firm* — Laurence S. Roach, Esq.

(57) ABSTRACT

A head up display system presents a virtual image to a human driver of a motor vehicle. A plurality of light emitting devices are substantially aligned in a row and each emits light. There is a direct relationship between an electrical current drawn by each individual light emitting device and a distance each individual light emitting device is disposed from a center of the row. At least one mirror reflects the light emitted by the light emitting devices toward a windshield of the motor vehicle such that the light is reflected by the windshield and is visible to the human driver as the virtual image.

21 Claims, 5 Drawing Sheets

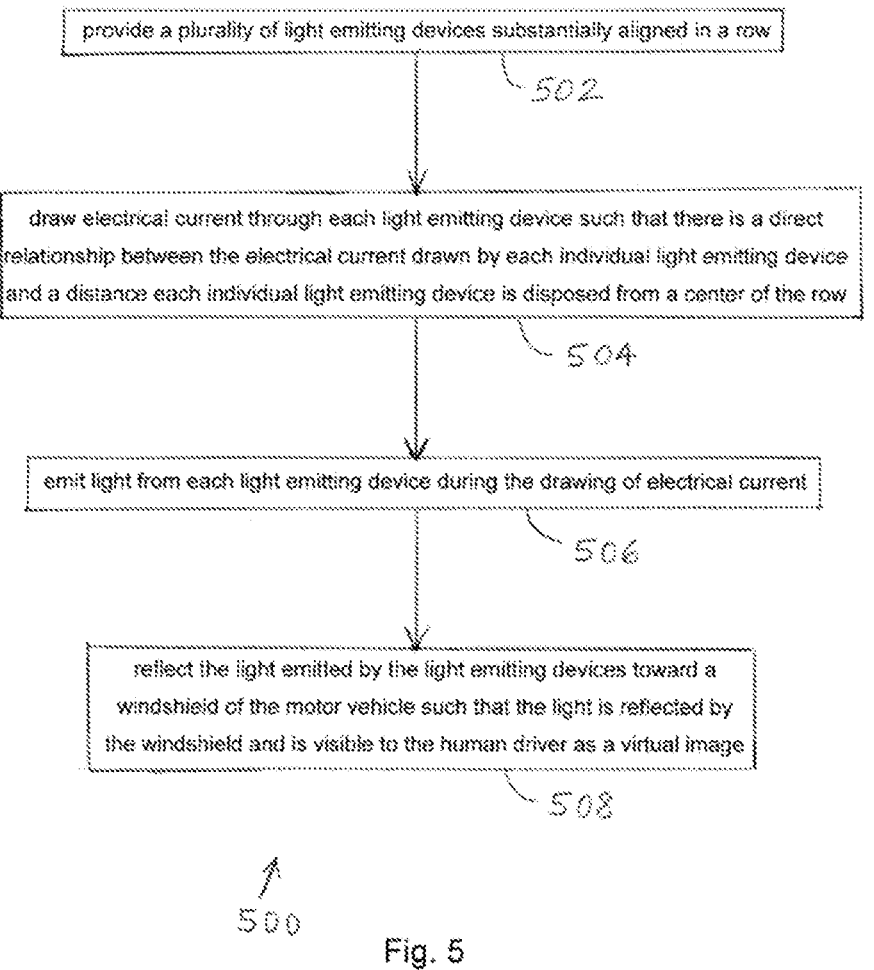

provide a plurality of light emitting devices substantially aligned in a row

502 draw electrical current through each light emitting device such that there is a direct relationship between the electrical current drawn by each individual light emitting device and a distance each individual light emitting device is disposed from a center of the row

504 emit light from each light emitting device during the drawing of electrical current

506 reflect the light emitted by the light emitting devices toward a windshield of the motor vehicle such that the light is reflected by the windshield and is visible to the human driver as a virtual image

METHOD TO OPTIMIZE UNIFORMITY OF HEAD-UP DISPLAY IMAGE BRIGHTNESS

CROSS-REFERENCED TO RELATED APPLICATIONS

This application claims benefit of U.S. Provisional Application No. 63/319,925 filed on Mar. 15, 2022, the disclosure of which is hereby incorporated by reference in its entirety for all purposes.

BACKGROUND OF THE INVENTION

1. Field of the Invention

The present invention relates to a head up display (HUD) of a motor vehicle.

2. Description of the Related Art

A head up display emits light that reflects from the front windshield to be seen by the driver. The light appears to come from a virtual image in front of the driver and in front of the windshield. This type of head up display is currently commercially available.

Conventional head up displays create the virtual image by first using a display or picture generation unit to create an image. Next, the light from the image is reflected from one or more mirrors. Next, the light from the mirrors is directed up to the windshield and is then reflected from the windshield towards the driver. The mirrors are designed and positioned relative to the display so that the light seen by the driver, which is reflected from the windshield, appears to come from a virtual image that is outside of the vehicle. The mirrors and display are typically contained in a package that occupies a volume beneath the top surface of the dashboard.

The illumination or back lighting for a head up display may be provided by a row of aligned, evenly spaced light emitting diodes (LEDs). The state-of-the-art is to space the LEDs equally and pass the same current through all of the LEDs. A driver in a vehicle with a head-up display expects the entire virtual image to appear uniform in brightness if the virtual image is intended to have constant brightness. Ideally, when a head-up display is projecting an all-white image to be seen by the driver, the brightness as seen by the driver, from any point in the eyebox, is uniform for all of the desired field-of-view. Ideally, the driver would see uniform brightness within the entire field-of-view of the HUD virtual image from any location in the eyebox.

A problem is that central areas of the display are brighter than outer areas because the central areas are illuminated by multiple LEDs on each of two sides (i.e., by light coming from two different, and substantially opposite directions). The outer areas of the display are dimmer, in contrast, because their illumination is provided primarily by LEDs on only one side of the outer area (i.e., by LEDs either directly below the outer area or more centrally located LEDS). Complicating this problem is that, when manufactured, individual LEDs do not output exactly the same amount of light for a given current input.

SUMMARY OF THE INVENTION

The invention may improve the uniformity of the luminance of the virtual image of an automotive head-up display, as seen by the driver. The invention may be applied to a head-up display that uses a single row of light emitting diodes (LEDs) as the light source for a display.

According to the invention, the currents through the individual LEDs, and the spacings between the individual LEDs, may be different depending on the positions of the particular LEDs in order to optimize the uniformity of the luminance as seen by the driver. The invention may also account for the individual variation of the LEDs by tailoring the current through individual LEDs in order to compensate for the variation of individual parts.

The invention comprises, in one form thereof, a head up display system that presents a virtual image to a human driver of a motor vehicle. A plurality of light emitting devices are substantially aligned in a row and each emits light. There is a direct relationship between an electrical current drawn by each individual light emitting device and a distance each individual light emitting device is disposed from a center of the row. As used herein, a "direct relationship" between two things means that as one increases the other also increases, and as one decreases, the other also decreases. However, "direct relationship" does not require that there be a linear relationship between values of the two things (e.g., that there be equal percentage or proportional percentage increases in the values of the two things). At least one mirror reflects the light emitted by the light emitting devices toward a windshield of the motor vehicle such that the light is reflected by the windshield and is visible to the human driver as the virtual image.

The invention comprises, in another form thereof, a method for presenting a virtual image to a human driver of a motor vehicle, including providing a plurality of light emitting devices substantially aligned in a row. Electrical current is drawn through each light emitting device such that there is a direct relationship between the electrical current drawn by each individual light emitting device and a distance each individual light emitting device is disposed from a center of the row. Light is emitted from each light emitting device while they draw the electrical current. At least one mirror is used to reflect the light emitted by the light emitting devices toward a windshield of the motor vehicle such that the light is reflected by the windshield and is visible to the human driver as the virtual image.

The invention comprises, in yet another form thereof, a head up display system that presents a virtual image to a human driver of a motor vehicle. A plurality of light emitting devices are substantially aligned in a row and each emits light. There is an inverse relationship between a gap separating each adjacent pair of the light emitting devices and a distance each adjacent pair of light emitting devices is disposed from a center of the row. As used herein, an "inverse relationship" between two things means that as one increases the other decreases, and as one decreases, the other increases. However, "inverse relationship" does not require that there be a linear change in the values of the two things (i.e., that the changes in the values of the two things be of an equal percentage or proportional percentage). At least one mirror reflects the light emitted by the light emitting devices toward a windshield of the motor vehicle such that the light is reflected by the windshield and is visible to the human driver as the virtual image.

An advantage of the invention is that the variation of measured luminance over the entire display, as seen by the driver, may be less than 25 percent of the mean value.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein:

FIG. 5 is a flow chart of one embodiment of a method of the present invention for presenting a virtual image to a human driver of a motor vehicle.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

Figure 1:
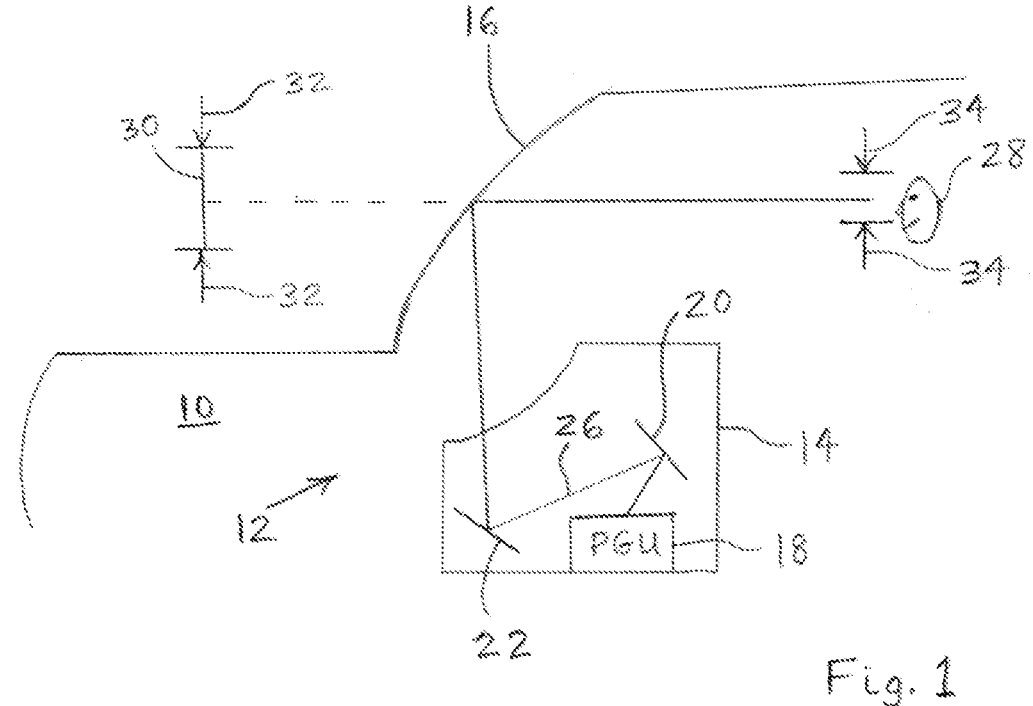
FIG. 1 is a schematic side view of one embodiment of a motor vehicle including a HUD arrangement of the present invention.

FIG. 1 illustrates one embodiment of a motor vehicle 10 including a head up display (HUD) arrangement 12 of the present invention, including a HUD unit 14 and a windshield 16. HUD unit 14 may include a picture generation unit (PGU) 18, a fold mirror 20, and a second mirror 22.

During use, a light field 26 from PGU 18, after being first reflected by mirror 20, may be reflected by mirror 22 and then by windshield 16 such that the reflection is visible to a driver 28 as a virtual image 30 within field of view 32 when the driver's eyes are within eyebox 34.

Figure 2:
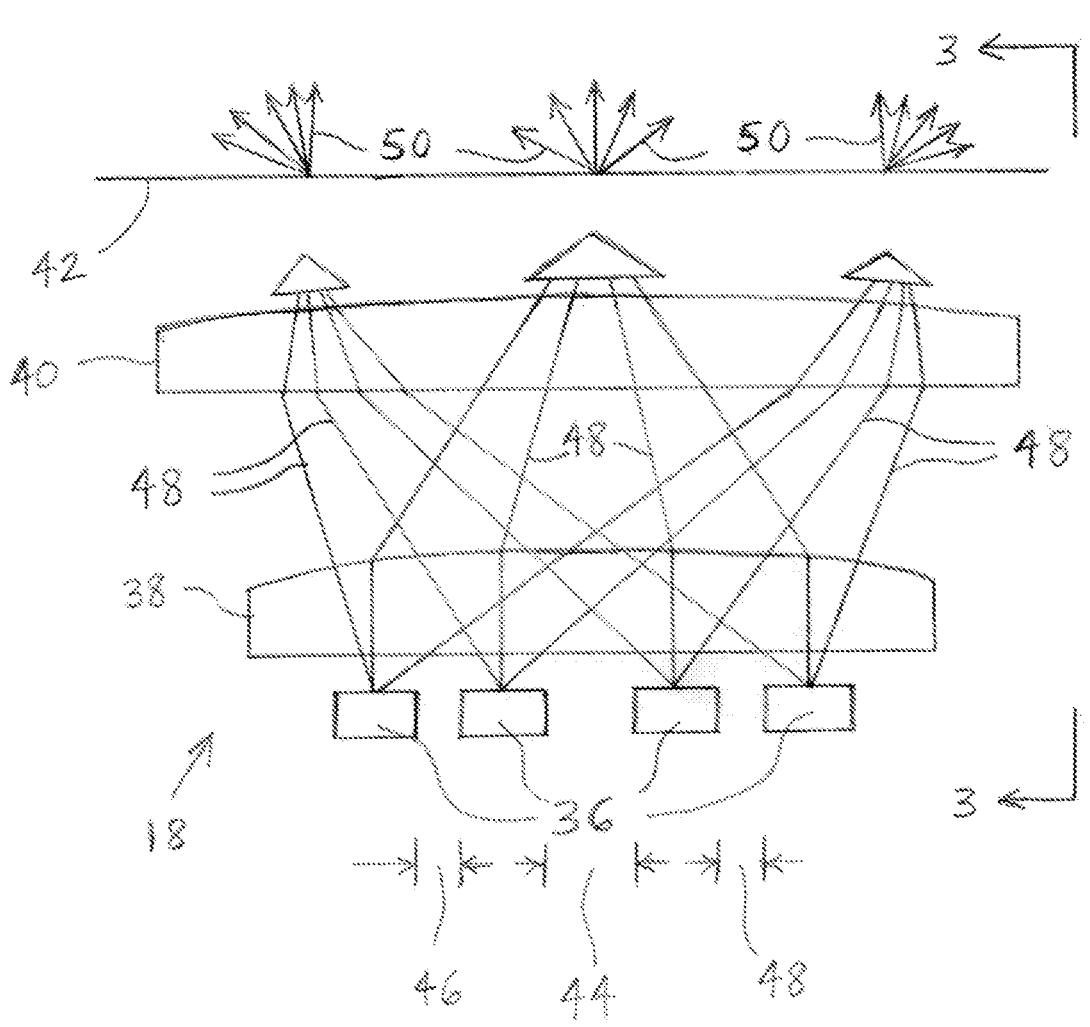
FIG. 2 is a schematic front view of the picture generation unit of the HUD arrangement of FIG. 1.
Figure 3:
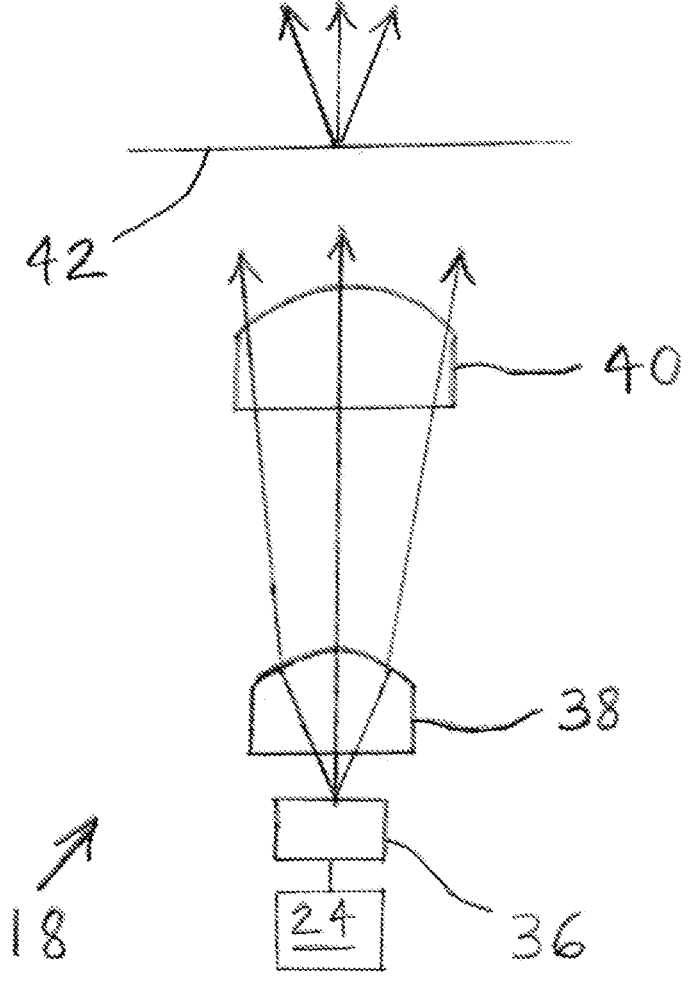
FIG. 3 is a schematic side view of the picture generation unit of FIG. 2 along line 3-3.

FIG. 2 further illustrates PGU 18 of FIG. 1, including four light emitting diodes (LEDs) 36, free form lenses 38, 40, and a diffuser 42. A gap or spacing 44 between the two centermost LEDs 36 is greater than the gaps or spacings 46, 48 between adjacent pairs of outermost LEDs 36. Spacings 46, 48 may be equal. In one embodiment, spacing 44 is 100% greater than (i.e., twice as great as) spacings 46, 48. Spacing 44 can be between 0.1% and 200% greater than spacings 46, 48. In another embodiment, spacing 44 can be between 1% and 40% greater than spacings 46, 48. In yet another embodiment, spacing 44 can be between 5% and 20% greater than spacings 46, 48. As is evident from FIGS. 2 and 3, LEDs 36 are arranged in a one-dimensional array (i.e., a single row). A current source 24 may individually control the current drawn by each of LEDs 36. Current source 24 may possibly include an electronic processor (not shown) for controlling the current through each LED 36.

During use, LEDs 36 emit light towards lens 38, as indicated by lines 48. Lens 38 focuses the received light toward lens 40. Lens 40 focuses the light from lens 38 toward diffuser 42. The light received by diffuser 42 is emitted in various directions, as indicated by lines 50.

In order to even out the perceived brightness of PGU 18, the two outermost LEDs may be caused to draw more current than the two centermost LEDs. For example, the two outermost LEDs may each be connected in series with a respective resistor (not shown) that is of a lesser resistance value in terms of ohms than the respective resistors that are connected in series with the two centermost LEDs. Thus, with a same voltage applied across each LED and its respective resistor, the outermost LEDs may draw more current than the centermost LEDs. The resistors may be disposed within, or outside of, current source 24.

In one embodiment, the two outermost LEDs draw between 1% and 100% more current than the two centermost LEDs. In another embodiment, the two outermost LEDs draw between 5% and 20% more current than the two centermost LEDs.

Figure 4:
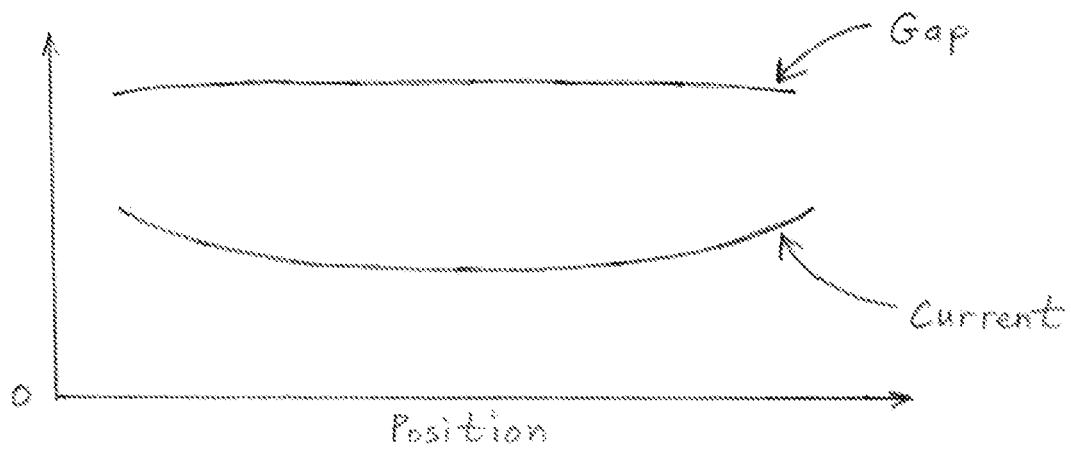
FIG. 4 is a schematic overhead view of the LEDs of one embodiment of a picture generation unit of the present invention; a plot of the gap between adjacent LEDs versus LED position; and a plot of LED current versus LED position.
Figure 4:
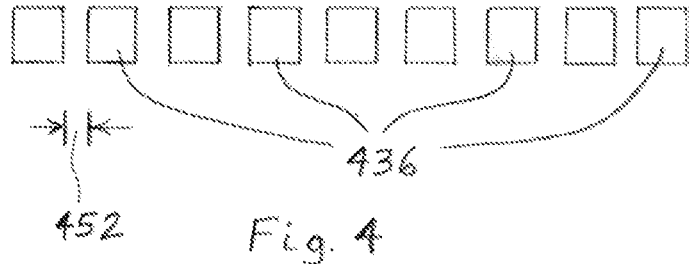

FIG. 4 illustrates the LEDs 436 of one embodiment of a picture generation unit of the present invention, where LEDs 436 are aligned in a row. Above LEDs 436 in FIG. 4 is a plot of an optimized gap 452 between adjacent LEDs versus LED position along the row of LEDs. Also plotted is the optimized current drawn by each LED as a function of LED position along the row of LEDs. As can be ascertained from a close inspection of the plots of FIG. 4, gap 452 between the centermost LEDs 436 may be approximately between 3% and 4% greater than gap 452 between the outermost LEDs 436, and the current through the outermost LEDs 436 may be approximately between 55% and 70% greater than the current through the centermost LED 436.

It can also be seen in FIG. 4 that the rate of increase in LED current as a function of LED distance from the center of the row increases with distance from the center of the row. That is, the second derivative of current as a function of distance from the center is positive.

It can also be seen in FIG. 4 that the rate of decrease in the gap between adjacent LEDs as a function of LED distance from the center of the row increases with distance from the center of the row. That is, the second derivative of the gap as a function of distance from the center is negative.

In one embodiment, gaps 452 are fixed and permanently established during the design and manufacture of a printed circuit board (not shown) on which LEDs 436 are mounted. The current through each individual LED 436, however, is adjusted during assembly to achieve even brightness over the entire picture generation unit. The current through each individual LED 436 may be adjusted, for example, by modifying the value of individual potentiometers, each of which may be connected in series with a respective LED 436. The LED currents needed to achieve the even brightness may be dependent upon the characteristics of the individual LEDs 436 that are placed in the picture generation unit. It is also possible within the scope of the invention, however, for gaps 452 to be adjustable during assembly, and/or for the LED currents to be fixed during design and manufacture.

FIG. 5 illustrates one embodiment of a method 500 of the present invention for presenting a virtual image to a human driver of a motor vehicle. In a first step 502, a plurality of light emitting devices are provided substantially aligned in a row. For example, four light emitting diodes (LEDs) 36 are substantially aligned in a row.

In a next step 504, electrical current is drawn through each light emitting device such that there is a direct relationship between the electrical current drawn by each individual light emitting device and a distance each individual light emitting device is disposed from a center of the row. For example, the two outermost LEDs 36 in FIG. 2 may be caused to draw more current than the two centermost LEDs 36.

Next, in step 506, light is emitted from each light emitting device during the step of drawing electrical current. For example, each of LEDs 36 may emit light while they draw current.

In a final step 508, the light emitted by the light emitting devices is reflected toward a windshield of the motor vehicle such that the light is reflected by the windshield and is visible to the human driver as a virtual image. For example, a light field 26 from LEDs 36, after being first reflected by mirror 20, may be reflected by mirror 22 and then by windshield 16 such that the reflection is visible to a driver 28 as a virtual image 30 within field of view 32 when the driver's eyes are within eyebox 34.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A head up display system for presenting a virtual image to a human driver of a motor vehicle, the system comprising:
    a plurality of light emitting devices substantially aligned in a row and each configured to emit light, wherein there is a direct relationship between an electrical current drawn by each individual said light emitting device and a distance each individual said light emitting device is disposed from a center of the row; and
    at least one mirror configured to reflect the light emitted by the light emitting devices toward a windshield of the motor vehicle such that the light is reflected by the windshield and is visible to the human driver as the virtual image.

2. The system of claim 1 wherein a rate of increase in the electrical current drawn by each individual said light emitting device increases with the distance each individual said light emitting device is disposed from a center of the row.

3. The system of claim 1 wherein the current through an outermost said light emitting device is approximately between 50% and 75% greater than the current through a centermost said light emitting device.

4. The system of claim 1 wherein the light emitting devices comprises light emitting diodes.

5. The system of claim 1 further comprising at least one lens positioned and configured to receive the light emitted by the light emitting devices, the at least one mirror being positioned and configured to receive and reflect the emitted light after the emitted light has passed through the at least one lens.

6. The system of claim 5 further comprising a diffuser positioned and configured to receive the emitted light passed by the at least one lens, the at least one mirror being positioned and configured to receive and reflect the emitted light after the emitted light has passed through the diffuser.

7. The system of claim 1 wherein there is an inverse relationship between a gap between each adjacent pair of the light emitting devices and a distance each said adjacent pair of light emitting devices is disposed from a center of the row.

8. A method for presenting a virtual image to a human driver of a motor vehicle, the method comprising:
    providing a plurality of light emitting devices substantially aligned in a row;
    drawing electrical current through each said light emitting device such that there is a direct relationship between the electrical current drawn by each individual said light emitting device and a distance each individual said light emitting device is disposed from a center of the row;
    emitting light from each said light emitting device during the step of drawing electrical current; and reflecting the light emitted by the light emitting devices toward a windshield of the motor vehicle such that the light is reflected by the windshield and is visible to the human driver as the virtual image.

9. The method of claim 8 wherein a rate of increase in the electrical current drawn by each individual said light emitting device increases with the distance each individual said light emitting device is disposed from a center of the row.

10. The method of claim 8 wherein the current through an outermost said light emitting device is approximately between 50% and 75% greater than the current through a centermost said light emitting device.

11. The method of claim 8 wherein the light emitting devices comprise light emitting diodes.

12. The method of claim 8 further comprising using at least one lens to receive the light emitted by the light emitting devices, the emitted light being reflected after the emitted light has passed through the at least one lens.

13. The method of claim 12 further comprising using a diffuser to receive the emitted light passed through the at least one lens, the emitted light being reflected after the emitted light has passed through the diffuser.

14. The method of claim 8 wherein there is an inverse relationship between a gap between each adjacent pair of the light emitting devices and a distance each said adjacent pair of light emitting devices is disposed from a center of the row.

15. A head up display system for presenting a virtual image to a human driver of a motor vehicle, the system comprising:
    a plurality of light emitting devices substantially aligned in a row and each configured to emit light, wherein there is an inverse relationship between a gap between each adjacent pair of the light emitting devices and a distance each said adjacent pair of light emitting devices is disposed from a center of the row; and
    at least one mirror configured to reflect the light emitted by the light emitting devices toward a windshield of the motor vehicle such that the light is reflected by the windshield and is visible to the human driver as the virtual image.

16. The system of claim 15 wherein a rate of decrease in the gap between adjacent said light emitting devices increases with the distance of the adjacent light emitting devices from a center of the row.

17. The system of claim 15 wherein the gap between a centermost pair of said light emitting devices is approximately between 5% and 20% greater than the gap between an outermost pair of said light emitting devices.

18. The system of claim 15 wherein the light emitting devices comprises light emitting diodes.

19. The system of claim 15 further comprising at least one lens positioned and configured to receive the light emitted by the light emitting devices, the at least one mirror being positioned and configured to receive and reflect the emitted light after the emitted light has passed through the at least one lens.

20. The system of claim 19 further comprising a diffuser positioned and configured to receive the emitted light passed by the at least one lens, the at least one mirror being positioned and configured to receive and reflect the emitted light after the emitted light has passed through the diffuser.

21. The system of claim 15 wherein there is a direct relationship between an electrical current drawn by each individual said light emitting device and a distance each individual said light emitting device is disposed from a center of the row.

* * * * *